United States Patent [19]

Palara

[11] 4,268,796
[45] May 19, 1981

[54] LINEAR AMPLIFIER WITH DISTORTION CORRECTION

[75] Inventor: Sergio Palara, S. Martino di Ferrara, Italy

[73] Assignee: SGS-ATES Componenti Elettronici S.p.A., Agrate Brianza, Italy

[21] Appl. No.: 24,077

[22] Filed: Mar. 26, 1979

[30] Foreign Application Priority Data

Mar. 30, 1978 [IT] Italy .................... 21744 A/78

[51] Int. Cl.³ ............................................. H03F 3/30
[52] U.S. Cl. ..................................... 330/267; 330/156
[58] Field of Search .............. 330/156, 265, 267, 268, 330/270, 273, 274

[56] References Cited

PUBLICATIONS

Bernays, "Extend Audio-Amplifier Performance", *Electronic Design 6*, Mar. 14, 1968, pp. 182–188.

*Primary Examiner*—James B. Mullins
*Attorney, Agent, or Firm*—Karl F. Ross

[57] ABSTRACT

An a-c linear amplifier with two push-pull-connected output transistors includes an ancillary transistor which, during saturation of one of the output transistors and the simultaneous cutoff of a controlled transistor driving these output transistors through a set of pilot transistors, conducts to maintain the base potential of this controlled transistor at its conduction threshold for preventing a distortion of the end of the flattened peak of the corresponding half-cycle of the output voltage. The ancillary transistor has one of its input leads maintained at a fixed biasing potential and the other of its input leads connected to a point of output-dependent variable voltage that allows its conduction during the flattened peak only.

8 Claims, 6 Drawing Figures

LINEAR AMPLIFIER WITH DISTORTION CORRECTION

FIELD OF THE INVENTION

My present invention relates to an a-c linear amplifier of the type comprising a final stage with a pair of cascaded output transistors operating in Class B or AB. The output transistors are driven in push-pull by way of an input stage and an intermediate stage, the input stage including a first or controlling transistor which drives during alternate half-cycles of the oscillations to be amplified so as to cut off a second or controlled transistor operating in Class A. One output transistor, i.e. the one closer to the high-voltage terminal of the supply, saturates when the second transistor is cut off.

BACKGROUND OF THE INVENTION

The output voltage generated by an amplifier of this type is substantially sinusoidal, except for the flattened peaks of its half-cycles resulting from the clipping effect due to saturation of the output transistors. The symmetry of the wave flanks, however, is disturbed specifically by the aforementioned second transistor to which the oscillations to be amplified are applied. As the first transistor overdrives the second transistor, the virtual capacitance at the input of the second transistor controlled thereby (formed between the base and the emitter of the latter transistor) is partly discharged so that a certain charging current must flow into that input capacitance at the end of the saturation interval before this second transistor will again conduct. This delays the desaturation of the one output transistor referred to above, whose operation is in phase with that of the first transistor in the input stage, leading to a distortion of the wave shape of the amplified output signal.

Such a distortion is particularly unwelcome when the cascaded output transistors are connected across an unbalanced d-c power supply; in that case, the harmonics generated by the distorted signal peak may strongly interfere with nearby electronic equipment, aside from entailing a substantial loss of power.

Since the delay in the recharging of the virtual input capacitance of the controlled transistor is determined by the circuit parameters and is practically independent of frequency, the resulting distortion becomes more significant at the higher frequencies of the operating range.

OBJECT OF THE INVENTION

The object of my present invention, accordingly, is to provide an improved amplifier of the above-described type in which this distortion of the output oscillation, especially at its high-voltage peak, is substantially avoided.

SUMMARY OF THE INVENTION

In accordance with my present invention I provide a normally nonconductive ancillary transistor connected to at least one of the amplifier stages for temporarily conducting upon cutoff of the controlled ("second") transistor and supplying same with a supplemental biasing voltage which maintains the controlled transistor at its conduction threshold throughout the time of saturation of the output transistor closer to the high-voltage terminal of the power supply.

When the controlled transistor has an emitter electrode connected to the low-voltage terminal and a collector electrode connected to the high-voltage terminal of the power supply (with inclusion of the usual resistors and/or constant-current generators in these connections) as well as a base electrode connected to the input stage of the amplifier, the ancillary transistor may have a base lead connected to a point of fixed biasing potential and an emitter lead connected to either the collector electrode or the base electrode of the controlled transistor, depending on whether the ancillary transistor is to function as a current generator or as a voltage generator. In the first instance the collector lead of the ancillary transistor may be connected to the base electrode of the controlled transistor or to a point of the input stage upstream of the controlling transistor; in the second instance this collector lead may be connected directly or indirectly to the high-voltage terminal of the power supply.

The connection between the collector electrode of the controlled transistor and the high-voltage supply terminal may further include a so-called bootstrap capacitor which boosts the potential of that electrode, during the saturation interval, to an absolute value higher than that of the high-voltage terminal itself, allowing the base of the ancillary transistor to be tied directly to the latter terminal.

BRIEF DESCRIPTION OF THE DRAWING

My invention will now be described in greater detail with reference to the accompanying drawing in which.

SPECIFIC DESCRIPTION

Figure 1:
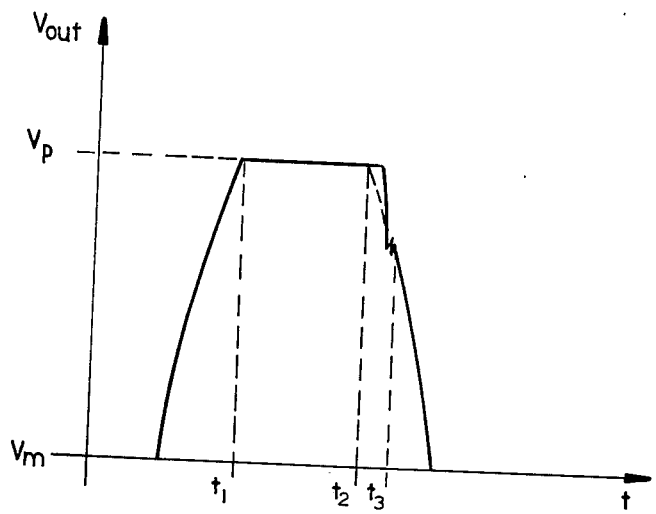
FIG. 1 is a graph showing a positive half-cycle of a-c oscillation in the output of a linear amplifier with and without the present improvement.

In FIG. 1 I have shown the upper half of a clipped sine wave, representing the output voltage $V_{out}$ of a multistage linear amplifier, which rises sinusoidally from a mean level $V_m$ to a flattened peak at a level $V_p$ reached at a time $t_1$. This peak, not drawn to scale, theoretically lasts to an instant $t_2$ when the voltage curve begins to descend sinusoidally (dotted line) and symmetrically to its rising branch. In practice, however, the descent is retarded beyond instant $t_2$ and produces some undesired harmonics before rejoining the theoretical curve at instant $t_3$. This delay is the result of saturation phenomena, already discussed hereinabove, occurring mainly in one or more components of the amplifier ahead of its final stage.

Figure 2:
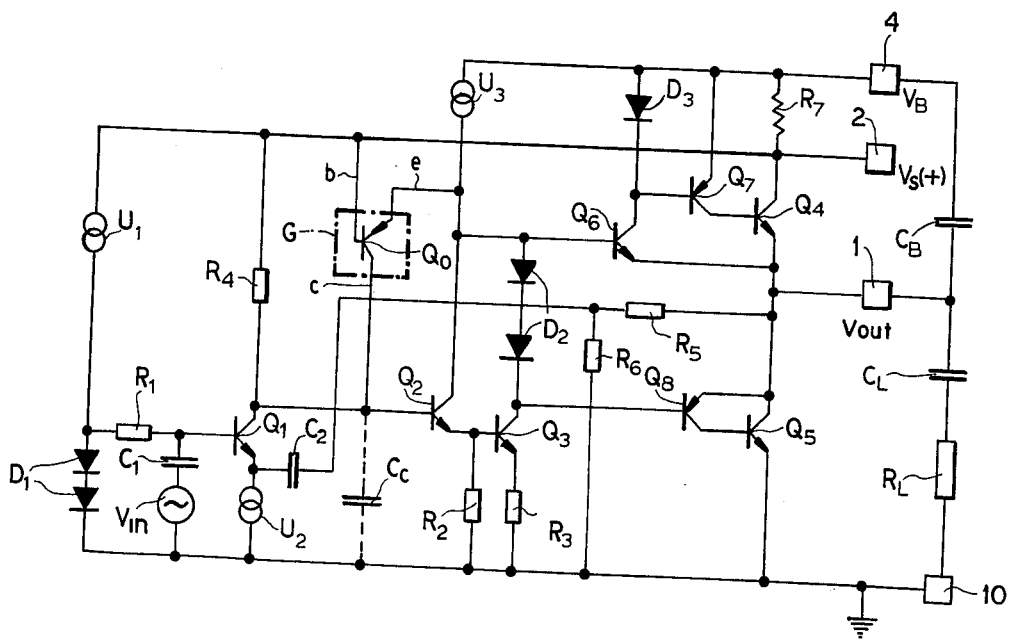
FIG. 2 is a circuit diagram of an amplifier embodying my invention.

In FIG. 2 I have shown an amplifier of the type here considered (generally similar to one shown in commonly owned U.S. Pat. No. 3,828,265) which comprises an input stage including a first NPN transistor $Q_1$, an intermediate stage with a second NPN transistor $Q_2$ connected to an NPN transistor $Q_3$ in a Darlington configuration, and a final stage with further NPN transistors $Q_4$ and $Q_5$ as well as associated pilot transistor $Q_6$ of NPN type and $Q_7$, $Q_8$ of PNP type. Output transistors $Q_4$ and $Q_5$ are connected between terminals 2 and 10 of a d-c power supply, terminal 2 carrying a positive voltage $V_S$ whereas terminal 10 is grounded. The emitter of transistor $Q_4$ and the collector of transistor $Q_5$ are connected to a common central terminal 1 carrying the output voltage $V_{out}$.

An oscillator labeled $V_{in}$ symbolizes a source of a-c signals to be amplified, this oscillator being connected via a series capacitor $C_1$ between the base and the emitter of transistor $Q_1$ which is inserted between supply terminals 2 and 10 via a collector resistor $R_4$ and a constant-current generator $U_2$. A stack of diodes $D_1$ and another constant-current generator $U_1$ as well as a resistor $R_1$ form part of a biasing circuit for the base of transistor $Q_1$. A feedback path exists between output terminal 1 and the emitter of transistor $Q_1$, this path including a resistor $R_5$ and a capacitor $C_2$ in series.

The collector of transistor $Q_1$ is joined to the base of transistor $Q_2$ whose emitter is tied to the base of transistor $Q_3$ and is grounded through a resistor $R_2$, a similar resistor $R_3$ grounding the emitter of transistor $Q_3$. A "bootstrap" terminal 4 is coupled to output terminal 1 via a capacitor $C_B$ and is connected to supply terminal 2 through a resistor $R_7$; terminal 4 feeds the collector of transistor $Q_2$ through a constant-current generator $U_3$ to which the collector of pilot transistor $Q_3$ is also connected by way of a stack of diodes $D_2$. The collectors of transistors $Q_2$ and $Q_3$ are further tied to the bases of pilot transistors $Q_6$ and $Q_8$, respectively, the latter transistor being linked with output transistor $Q_5$ in a composite configuration. Transistor $Q_6$, whose emitter is connected to output terminal 1, has its collector connected via a diode $D_3$ to bootstrap terminal 4 to which the emitter of transistor $Q_7$ is also connected; the latter transistor, whose base is tied to the collector of transistor $Q_6$, forms with diode $D_3$ a current mirror. A load $R_L$ is inserted between output terminal 1 and ground in series with a capacitor $C_L$.

In accordance with my present invention, an intermittently operative current generator G comprises an ancillary transistor $Q_O$ (here of PNP type) having a base lead b connected to supply terminal 2, an emitter lead e connected to the collector of transistor $Q_2$ and thus via generator $U_3$ to the bootstrap terminal 4 carrying a voltage $V_B$, and a collector lead c connected to the base of the latter transistor. At $C_c$ I have indicated a virtual capacitance existing between that base and ground, this capacitance tending to be partly discharged when transistor $Q_1$ is saturated during positive half-cycles of voltage $V_{in}$. In order to prevent such discharge, and thereby to avoid the delay discussed with reference to FIG. 1, the normally nonconductive transistor $Q_O$ goes into conduction as soon as the output transistor $Q_4$ has gone into saturation and lead e becomes positive with respect to lead b with the cutoff of controlled transistor $Q_2$, thereby generating a collector current on lead c which recharges the virtual capacitor $C_c$ to incipient conduction of transistor $Q_2$. When the transistor $Q_4$ thereafter desaturates, the ancillary transistor $Q_O$ is cut off, at precisely the time when the transistor $Q_1$ begins to drive the transistor $Q_2$ into full conduction.

Figure 3:
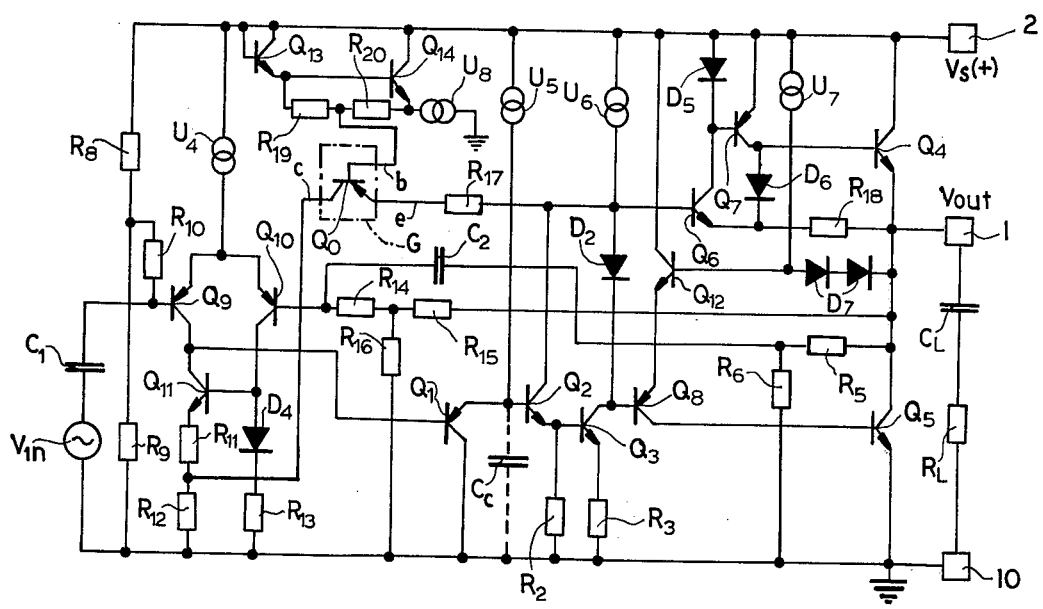
FIGS. 3 and 4 are circuit diagrams similar to FIG. 2, showing two other embodiments.

The amplifier shown in FIG. 3 differs somewhat from that of FIG. 2, corresponding components having been designated by the same reference characters. In this instance the oscillator $V_{in}$ and its series capacitor $C_1$ are connected between ground and the base of a PNP transistor $Q_9$ whose emitter, like that of a similar transistor $Q_{10}$, is connected through a constant-current generator $U_4$ to supply terminal 2; the base of transistor $Q_9$ is biased by a voltage divider $R_8$, $R_9$ connected between supply terminals 2 and 10, via a resistor $R_{10}$. Transistor $Q_9$ lies in series with an NPN transistor $Q_{11}$ whose emitter is grounded via two resistors $R_{11}$, $R_{12}$ having a junction tied to the collector lead c of ancillary transistor $Q_O$. The base of transistor $Q_{10}$ is connected to output terminal 1 through the feedback network $R_5$, $C_2$ which is here shunted by a series arm $R_{14}$, $R_{15}$ of a resistance network having a grounded shunt arm $R_{16}$. The collector of feedback transistor $Q_{10}$ is grounded through a diode $D_4$ in series with a resistor $R_{13}$ and is tied to the base of series transistor $Q_{11}$ forming therewith a current mirror. The base of controlled transistor $Q_3$ is connected to supply terminal 2 via a constant-current generator $U_5$; a similar constant-current generator $U_6$ feeds the emitter lead e of transistor $Q_O$ through a resistor $R_{17}$ and the collector of transistor $Q_3$ through a diode $D_2$. PNP transistor $Q_8$ has its emitter connected to terminal 2 through an NPN transistor $Q_{12}$ in series therewith, the base of the latter transistor being connected to output terminal 1 through a stack of diodes $D_7$ and to supply terminal 2 through a constant-current generator $U_7$. Two further diodes $D_5$ and $D_6$ respectively connect the base of pilot transistor $Q_7$ to supply terminal 2 and to the emitter of transistor $Q_6$ which in turn is joined to output terminal 1 by way of a resistor $R_{18}$.

A fixed biasing potential for the base lead b of ancillary transistor $Q_O$ is obtained in FIG. 3 from a voltage divider $R_{19}$, $R_{20}$ extending between the emitters of two NPN transistors $Q_{13}$ and $Q_{14}$, transistor $Q_{13}$ being connected as a diode between terminal 2 and the base of transistor $Q_{14}$ whose collector is tied to the same supply terminal and whose emitter is grounded through a constant-current generator $U_8$.

The biasing network including transistors $Q_{13}$, $Q_{14}$ and resistors $R_{19}$, $R_{20}$ (which may be considered part of the intermittently operable current generator G) is so dimensioned that transistor $Q_O$ conducts only when its emitter is driven sufficiently positive upon saturation of output transistor $Q_4$, as in the preceding embodiment. In this instance, however, collector lead c does not directly charge the virtual capacitance $C_c$ but supplies additional current to resistor $R_{12}$ so as to increase the voltage drop thereacross, thereby reducing the conductivity of transistor $Q_{11}$ and throttling the current flow through transistor $Q_1$ sufficiently to let generator $U_5$ bias the transistor $Q_2$ to its conduction threshold.

Figure 4:
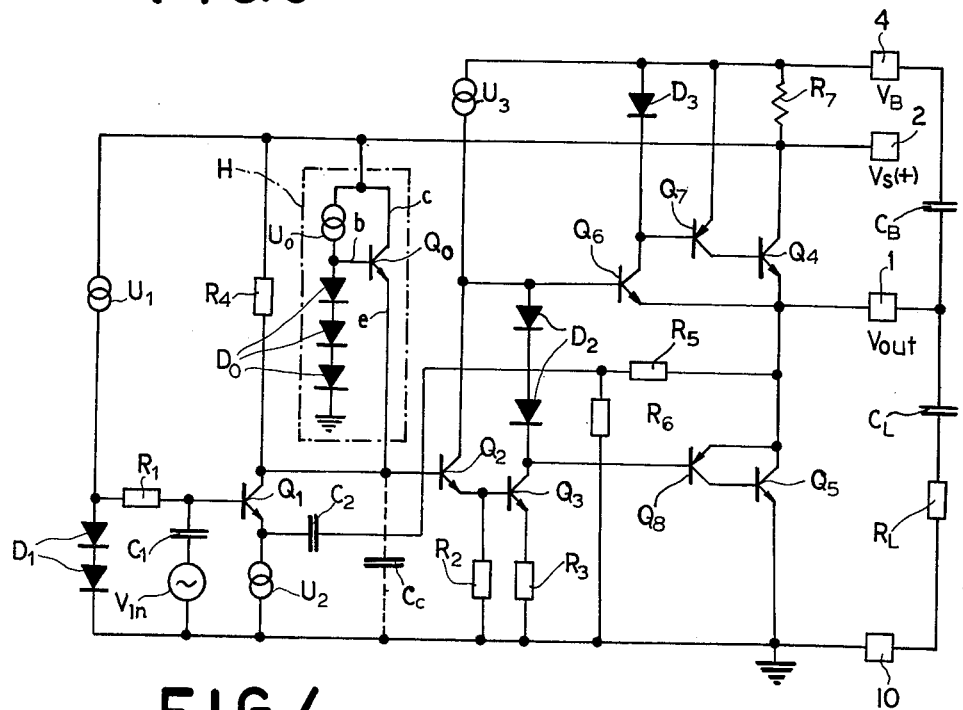

The system of FIG. 4 is substantially identical with that of FIG. 2, except that the current generator G including transistor $Q_O$ has been replaced by a voltage generator H comprising not only this ancillary transistor but also a voltage divider maintaining the base lead b thereof at a predetermined potential between ground and supply voltage $V_S$. This voltage divider is formed by a constant-current generator $U_O$ and a stack of diodes $D_O$; collector lead c is connected to supply terminal 2 in parallel with generator $U_O$.

With emitter lead e tied to the base of controlled transistor $Q_2$, and thus also to the collector of controlling transistor $Q_1$, transistor $Q_O$ conducts when the voltage on lead e drops below the conduction threshold of transistor $Q_2$ so as to maintain the base potential of the latter transistor at this threshold.

Figure 5:
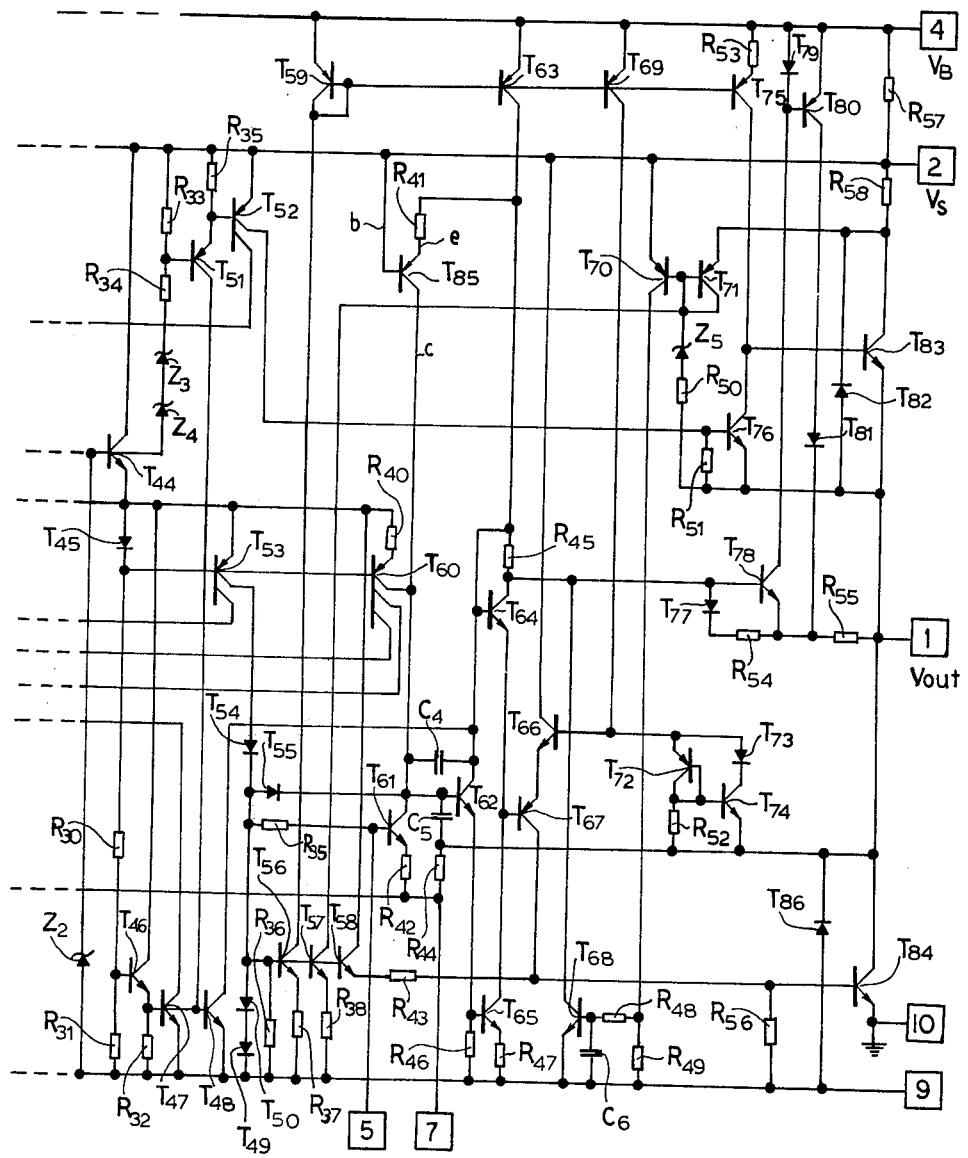
FIG. 5 is a more detailed diagram of part of an amplifier such as that of FIG. 2 realized in integrated circuitry.

The integrated-circuit arrangement of FIG. 5 includes transistors $T_{44}$–$T_{86}$ (some of them connected as diodes), Zener diodes $Z_2$–$Z_5$, resistors $R_{30}$–$R_{58}$ and capacitors $C_4$–$C_6$. In addition to the aforedescribed terminals 1, 2, 4 and 10 there are also shown a jack 3 and terminals 5 and 7 connectable to external circuits for biasing or modulation purposes, along with a subsidiary terminal 9 resistively connected to ground in a nonillustrated part of the circuit. Transistors $T_{83}$ and $T_{84}$ play the part of output transistors $Q_4$ and $Q_5$ of FIGS. 2–4; controlling transistor $Q_1$ and controlled transistor $Q_2$ are represented by transistors $T_{61}$ and $T_{62}$, respectively. The ancillary transistor according to my invention ($Q_O$ in FIGS. 2–4) is here represented by a transistor $T_{85}$ with its base (lead b) connected to supply terminal 2, its emitter (lead e) connected to bootstrap terminal 4 through resistor $R_{41}$ and transistor $T_{63}$, and its collector (lead c) connected to the base of controlled transistor $T_{62}$. Thus, the operation of the amplifier of FIG. 5 is analogous to that described with reference to FIG. 2. The bootstrap capacitor $C_B$ of FIGS. 2 and 4 has not been illustrated.

Figure 6:
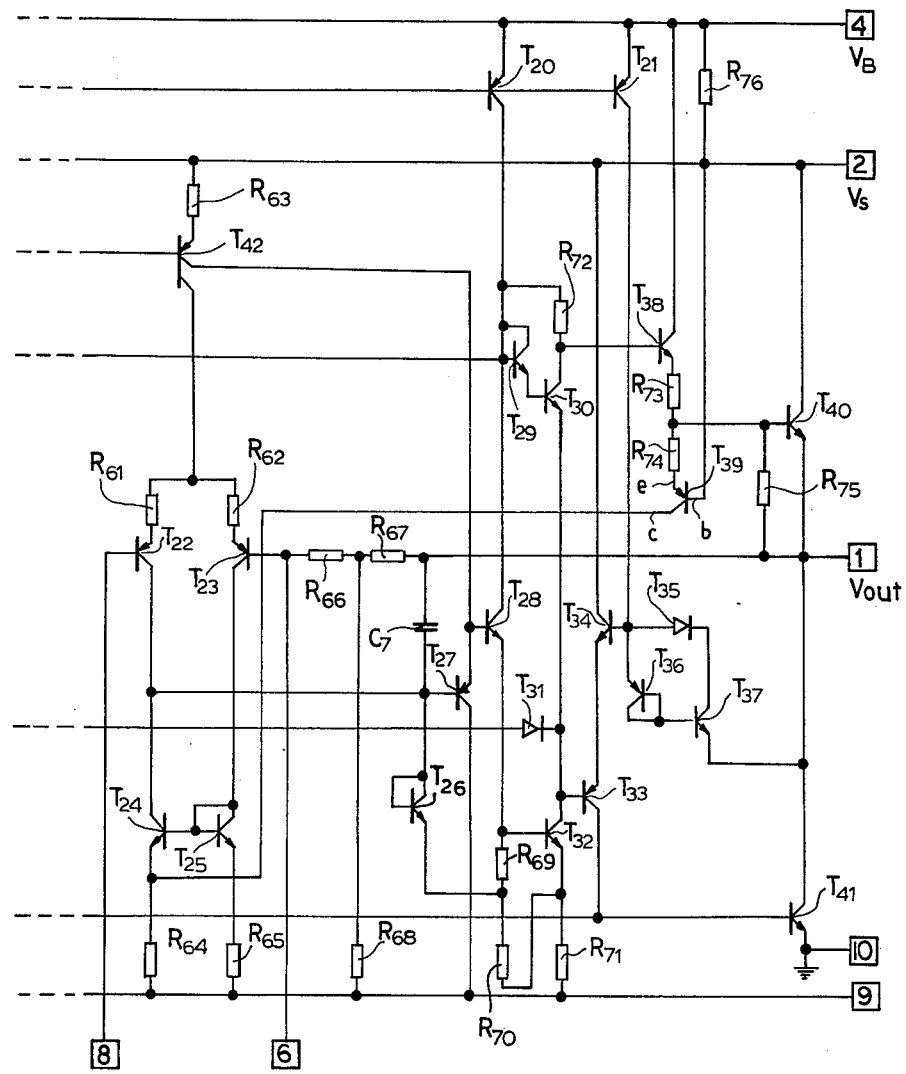
FIG. 6 is a diagram similar to FIG. 5 but relating to a modified amplifier.

The amplifier shown in FIG. 6, in which the aforedescribed terminals 1, 2, 4, 9 and 10 are supplemented by biasing or modulation terminals 6 and 8, comprises transistors $T_{20}$–$T_{42}$ (again partly connected as diodes), resistors $R_{61}$–$R_{76}$ and a capacitor $C_7$. The output transistors are here designated $T_{40}$ and $T_{41}$; transistors $T_{27}$ and $T_{28}$ respectively represent the controlling and controlled transistors. The ancillary transistor ($Q_O$ in FIGS. 2–4) is shown at $T_{39}$; its base lead b is tied to supply terminal 2 while its emitter lead e is connected to bootstrap terminal 4 by way of transistor $T_{38}$ and resistors $R_{73}$, $R_{74}$ which together with resistor $R_{75}$ control the base voltage of output transistor $T_{40}$. Transistor $T_{39}$ conducts when that base voltage saturates the transistor $T_{40}$, coincidentally with the saturation of controlling transistor $T_{27}$ which cuts off the controlled transistor $T_{28}$ and thus drives the base potential of pilot transistor $T_{38}$ to its highest positive value. The conduction of transistor $T_{39}$ energizes its collector lead c which extends to ground through the emitter resistor $R_{64}$ of transistor $T_{24}$; thus, the corrective operation is analogous to that described with reference to transistor $Q_{11}$ and resistor $R_{12}$ of FIG. 3.

It will be apparent that the described and illustrated modes of intermittent energization of the ancillary transistor according to my invention can be modified and that the desired effect of its conduction upon the saturation of the final stage of the amplifier can also be realized with output connections of that transistor different from those specifically disclosed. Thus, for example, the emitter of ancillary transistor $Q_O$ may be connected to either the input or the output of any transistor (such as final transistor $T_{40}$ in FIG. 6) upstream or downstream of controlled transistor $Q_2$. It is, of course, also possible to vary the base voltage rather than the emitter voltage of the ancillary transistor in order to render it conductive during the cut-off state of the second transistor only.

I claim:

1. In a linear a-c amplifier with a plurality of stages including an input stage, an intermediate stage and a final stage, a first transistor in said input stage receiving an a-c signal to be amplified, a second transistor operating in Class A under the control of said first transistor, and a pair of output transistors in said final stage driven in push-pull by said second transistor via said intermediate stage and connected in cascade across a d-c power supply for producing on a common central terminal an amplified replica of said a-c signal with alternate peaks clipped upon saturation of one of said output transistors coinciding with a cutoff of said second transistor during alternate half-cycles of said a-c signal, the combination therewith of a normally nonconductive ancillary transistor with an input connection to one of said stages for conducting only during the time of saturation of said one of said output transistors, said ancillary transistor being operatively coupled to said second transistor for biasing same to its conduction threshold prior to desaturation of said one of said output transistors.

2. The combination defined in claim 1 wherein said power supply has a low-voltage terminal and a high-voltage terminal, said one of said output transistors being a third transistor inserted between said high-voltage and central terminals, the other of said output transistors being a fourth transistor inserted between said central and low-voltage terminals.

3. The combination defined in claim 2 wherein said second transistor has an emitter electrode connected to said low-voltage terminal, a collector electrode connected to said high-voltage terminal via a constant-current generator, and a base electrode connected to said input stage, said ancillary transistor having a base lead connected to a point of fixed biasing potential and an emitter lead connected to an electrode of said second transistor.

4. The combination defined in claim 3 wherein said emitter lead is connected to said collector electrode, said ancillary transistor further having a collector lead connected to said base electrode.

5. The combination defined in claim 3 wherein said emitter lead is connected to said collector electrode, said ancillary transistor further having a collector lead connected to a point of said input stage upstream of said second transistor.

6. The combination defined in claim 3 wherein said emitter lead is connected to said base electrode, said ancillary transistor further having a collector lead connected to said high-voltage terminal.

7. The combination defined in claim 4 or 6 wherein the connection between said collector electrode and said high-voltage terminal includes a resistor whose junction with said constant-current generator is coupled to said central terminal via a capacitor driving said collector electrode to a potential higher in absolute value than that of said high-voltage terminal during said time of saturation.

8. The combination defined in claim 7 wherein said point of fixed biasing potential is said high-voltage terminal.

* * * * *